(12) United States Patent
Henneck

(10) Patent No.: US 6,661,156 B1
(45) Date of Patent: Dec. 9, 2003

(54) PIEZOCERAMIC MULTI-LAYER STRUCTURE WITH REGULAR POLYGON CROSS-SECTIONAL AREA

(75) Inventor: Stefan Henneck, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 68 days.

(21) Appl. No.: 09/830,767
(22) PCT Filed: Aug. 3, 2000
(86) PCT No.: PCT/DE00/02587
  § 371 (c)(1),
  (2), (4) Date: Aug. 6, 2001
(87) PCT Pub. No.: WO01/17038
  PCT Pub. Date: Mar. 8, 2001

(30) Foreign Application Priority Data

Aug. 28, 1999 (DE) .......... 199 41 044

(51) Int. Cl.⁷ .......... H01L 41/04
(52) U.S. Cl. .......... 310/328; 310/367; 310/364
(58) Field of Search .......... 310/328, 311, 310/364, 366, 367; 311/367; H01L 41/08; H02N 2/00

(56) References Cited

U.S. PATENT DOCUMENTS 5,937,493 A * 8/1999 Nellissen .......... 29/25.35
6,184,609 B1 * 2/2001 Johansson et al. .......... 310/328
2001/0017502 A1 * 8/2001 Kappel et al. .......... 310/328

FOREIGN PATENT DOCUMENTS

| EP | 0 977 284 | | 2/2000 | |
|---|---|---|---|---|
| JP | 4-91664 | * | 7/1990 | .......... H02N/2/00 |
| JP | 491664 A | * | 3/1992 | .......... H02N/2/00 |
| JP | 04 091 664 | | 3/1992 | |
| JP | 8-85206 | * | 9/1994 | .......... B41J/2/55 |
| WO | WO96/30935 | * | 3/1996 | .......... H01L/21/203 |
| WO | WO 96 30 935 | | 10/1996 | |
| WO | WO 97 36 365 | | 10/1997 | |

* cited by examiner

Primary Examiner—Thomas M. Dougherty
Assistant Examiner—Karen B Addison
(74) Attorney, Agent, or Firm—Kenyon & Kenyon

(57) ABSTRACT

A piezoelectric ceramic body in the form of a prism, which has a plurality of insulating layers arranged over one another and made of a piezoceramic material, the insulating layers being at least regionally separated from one another by a conducting layer made of an electrode material. The top view of the insulating layers at least approximates the shape of an n-gon, especially a regular n-gon, n being greater than four and especially being six, eight, or ten. Furthermore, the conducting layers cover each of the insulating layers so extensively that two adjacent insulating layers are only in direct contact with one another in the region of narrow dead zones regionally located at the outer edge of the insulating layers.

14 Claims, 2 Drawing Sheets

PIEZOCERAMIC MULTI-LAYER STRUCTURE WITH REGULAR POLYGON CROSS-SECTIONAL AREA

FIELD OF THE INVENTION

The present invention relates to a piezoelectric ceramic body.

BACKGROUND INFORMATION

Piezoceramic actuators made of a plurality of thin ceramic piezoelectric layers, which are each separated from one another by an electrode layer by which they are able to be electrically contacted and controlled, are widely known. In this connection, reference is made, for example, to K. Ruschmeyer's "Piezokeramik: Grundlagen, Werkstoff, Applikationen", expert-Verlag, Renningen, 1995, pages 36–45 in particular.

According to this publication, known piezo actuators are made, for example, of a PZT ceramic, i.e. $Pb(Ti_xZr_y)O_3$, where $0.40<x<0.60$, as ceramic, piezoactive layers, which can be controlled by internal electrodes attached between the layers and made of an Ag/Pd alloy or Pt.

Furthermore, to date, these piezoceramic actuators have had a block-shaped design including a quadrangular base, different possibilities for designing the internal electrodes existing, which, on the one hand, ensure that adjacent piezoceramic layers are electrically insulated and are simultaneously intended to minimize internal stresses in the ceramic body during operation.

SUMMARY OF THE INVENTION

In comparison with the related art, the piezoelectric ceramic body according to the present invention has the advantage that the present invention achieves a more uniform release of the green ceramic body after pressing the individual layers to form the green ceramic body, since the shape of the green ceramic body, or of the individual insulating layers that determine this shape, results in the differences in the distance of the mass elements of a layer from the center of mass of the layer being reduced. This is especially true in the case of a uniform n-gon that becomes increasingly cylindrical as the number of corners of the ceramic body increases.

Furthermore, there is an improved distribution of the mechanical stresses in the unavoidable dead zones of the insulating layers, particularly at the side edge of the ceramic body, which are subjected to a mechanical tensile stress in response to an electrical voltage being applied, and from which cracks have a greater probability of originating.

It is additionally advantageous that, as a result of the shape when pressing the individual layers of the ceramic body into the form of green foils, the number of problems that occur with respect to the homogeneity of the pressing can be reduced. This is based on the fact that, a, the interior angle in the corners of the n-gon increases, e.g. to 120° in the case of a regular hexagon, the friction in the corners during pressing into a female mold (insertion mold) is significantly reduced. Thus, by reducing the friction, the pressure is more uniformly distributed when laminating or pressing the green foils to form a green body, which is to be subsequently sintered to form the ceramic body, thereby generally leading to less waste during production, and to a more uniform quality and a longer operational or service life of the produced ceramic body, in addition to a more uniform lateral distribution of the tensile stress in the dead zones of the insulating layers.

Mechanical stresses in the dead zones, i.e., in the zones of the insulating layer that, due to electrode surfaces missing in this region, do not mechanically expand or contract, or due to leakage fields of the conducting layers, only mechanically expand or contract to a small extent because of the reverse piezoelectric effect, regularly lead to a greater probability of cracks forming in the dead zones, the cracks being capable of causing the ceramic body to break apart. This formation of cracks is essentially promoted by inhomogeneous tensile stresses in the ceramic body.

As such, it was determined to be particularly advantageous when the insulating layers are the shape of a regular hexagon or octagon.

In this case, it is advantageously possible to first contact the conducting layers at an angle of 120° or 135°, instead of at an angle of 90° in the case of a square base, the number of possible contacting variants also simultaneously increasing as a result of the accompanying increase in the number of lateral surfaces of the ceramic body. In this way, one can therefore initially complete the ceramic body according the present invention, in an advantageous manner, and, e.g. in the case of an octagon, produce two groups of four equivalent lateral surfaces, which can later be contacted to external electrodes attached to the lateral surfaces of the ceramic body in order to electrically control the conducting layers located between the insulating layers. In a subsequent functionality test of the completed ceramic body after sintering, one can select the combination of two lateral surfaces that has the best piezoelectric characteristics (targeted expansion in response to a predetermined voltage, minimization of short circuits, etc.) when contacting the external electrodes, each of the lateral surfaces being selected from one of the groups of four.

The tensile stress in the dead zones is uniformly distributed in a particularly advantageous manner, because of the increased number of lateral surfaces possessed by the shape of the produced ceramic body; because of three or four symmetrically arranged dead zones, which re located on the external side edge of the insulating layers, are as narrow as possible, and preferably extend over the region of all the corners of the regular n-gon; and because of three or four symmetrically arranged possibilities for the conducting layers to contact externally attached electrodes.

So, in the case of an octagon, the tensile stress, which occurs in the dead zones and is particularly high near the corners, is exemplarily distributed in an advantageous manner over eight corners and four lateral surfaces.

The particularly regular arrangement of the conducting layers between the insulating layers from the actual piezoceramic, in accordance with the present invention, also results in an improved spatial separation of the external electrodes, which are attached after the ceramic body is sintered and electrically contact each conducting layer in an alternating manner, on at least two lateral sides of the prism-shaped ceramic body. Thus, short circuits between two sequential conducting layers, which are each assigned to a different external electrode, are advantageously prevented. This is particularly true when the corners of the insulating layers and, thus, also the corners of the ceramic body produced in the shape of a prism are always formed by dead zones so that there is no contacting by the external electrodes in the region of the corners, and an effective spatial separation of the conducting-layers regions leading to the outside, between adjacent sides of the regular n-gon, is ensured.

Furthermore, in the exemplary case of a regular hexagon or octagon, where every conducting layer leads to the outside, on three or four symmetrically arranged sides, and two sequential conducting layers are rotated 60° or 45° relatively to each other, each produced, vertical prism advantageously has three or four completely equivalent, lateral sides. Thus, each of these lateral surfaces can be provided with external electrodes for controlling the conducting layers; in each case three or four electrodes that are also symmetrically arranged, due to the construction being contacted together with a pole of the external voltage source; and accordingly, the remaining three or four electrodes being contacted to the other pole of the external voltage source. Therefore, one advantageously has up to three or four equivalent, redundant connector contacts for each conducting layer, so that even when a contact with the assigned external electrode, within a conducting layer, is insufficient after sintering, the conducting layer is automatically controlled via the remaining connector contacts.

Furthermore, it is advantageous that the smearing problem known from the related art is significantly reduced in the case of the ceramic body according to the present invention. Smearing means that when the ceramic body is subsequently ground after sintering, for example to enable or improve the contacting of the conducting layers, electrode material, e.g. metal, is smeared over the lateral surfaces of the ceramic body, thereby resulting in adjacent conducting layers being short-circuited across the lateral surfaces of the ground block. This is prevented in the case of a ceramic body according to the present invention in that the corner regions of the n-gon are always made of the insulating-layer material, i.e., formed as a dead zone. Thus, when grinding a lateral surface, the metal present there from the conducting layers is only smeared on these lateral surfaces, which is even desired in some instances, but is at least not harmful, since in any case, all conducting layers, which are arranged on the respective lateral surface in such a manner that they reach the edge of the respective insulating layer, are to be contacted on this lateral surface by the same external electrode.

Therefore, during grinding, there is almost no undesired smearing "around the corner", i.e., metal being dragged from one lateral surface to another, since the corner regions are formed by metal-free dead zones that insulate over the entire height of the prism.

Too much of an increase in the number of corners of the especially regular n-gon also has disadvantages, since in such a case, the surface available for attaching the external electrodes on the lateral surfaces becomes increasingly smaller for an otherwise identical ceramic-body radius, and the surface occupied by the dead zones increases in relation to the entire lateral surface.

The optimum number of corners is between five and ten, an even number of corners, i.e., six, eight, and ten, being particularly advantageous in the case of regular n-gons.

In this case, in addition to other advantages involving symmetry, the number of n-gon sides, where a dead zone forms the insulating-layer edge, can be advantageously selected to be the same as the number of n-gon sides having a contact area, i.e., an area in which the conducting layer covers the subjacent insulating layer to the edge. In this context, the contact areas and dead zones advantageously alternate from side to side, at the edge of the n-gon.

Thus, the absolutely symmetrical design of the produced ceramic body in its cross-section results in a good compromise between stress distribution, available lateral surface, dead zone surface, number of connecting possibilities, and homogeneity during lamination or pressing.

Moreover, in the case of a regular n-gon, the shape of the conducting layers on the insulating layers is advantageously, fundamentally identical from conducting layer to conducting layer, however, adjacent conducting layers being arranged such that they are turned at an angle of 360°/n relatively to one another.

During production, in the case of the completely symmetrical construction of the conducting layers of a regular n-gon, rotation can always be carried out in the same direction, in an advantageous manner.

Furthermore, it is not suitable for the ceramic body to have a cylindrical shape as the limiting case of a regular n-gon having an extremely large number of corners, since this results in additional problems during adjustment, when selectively depositing the superposed layers, and when contacting the external electrodes. In addition, it is significantly more expensive and difficult to grind the lateral surfaces of cylindrical shapes than it is to grind those of prisms.

DETAILED DESCRIPTION

Figure 1A:
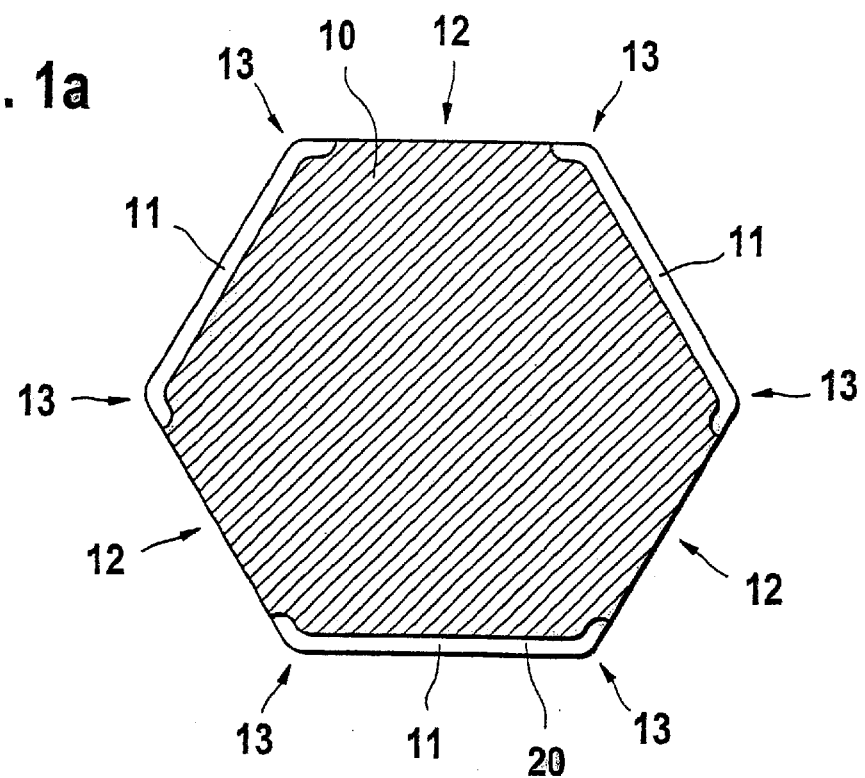
FIG. 1a shows a plan view of a first of two consecutive insulating layers within the layer sequence of the ceramic body, which are each provided with a conducting layer.

FIG. 1a shows a thin insulating layer 20 of a PZT ceramic known per se in the shape of a regular hexagon having six identical sides 12, the corners of the hexagon also being slightly rounded. For example, the PZT ceramic has the composition $Pb(Ti_xZr_y)O_3$, where $0.40<x<0.60$. The thickness of insulating layer 20 can be 50 $\mu$m to 150 $\mu$m. Furthermore, a first conducting layer 10 of a metallic Ag/Pd alloy known per se or of Pt is deposited on insulating layer 20. For example, first conducting layer 10 is deposited on insulating layer 20 using a screen-printing technique. Its thickness can be 500 nm to 5 $\mu$m, and preferably 1 $\mu$m to 3 $\mu$m.

In addition, first conducting layer 10 is deposited on insulating layer 20 in such a manner that dead zones 11 are formed, which are not covered by first conducting layer 10, i.e., the upper surface of insulating layer 20 initially continues to be freely accessible in the region of dead zones 11. Dead zones 11 are symmetrically arranged at the edge of insulating layer 20 and form three side edges of the hexagon. Their width is typically 30 $\mu$m to 1 mm, and preferably. 100 $\mu$m to 400 $\mu$m. In the above example, insulating layer 20 also occupies an area of approximately 100 mm$^2$. The radius of the rounded edges is approximately 0.5 mm.

Due to the shape of first conducting layer 10, it extends to the edge of the region of three sides 12 of the hexagon, and, for example, it completely covers insulating layer 20 there, along the side edge, for a distance of 4.2 mm so that a contact area is created there.

Figure 1B:
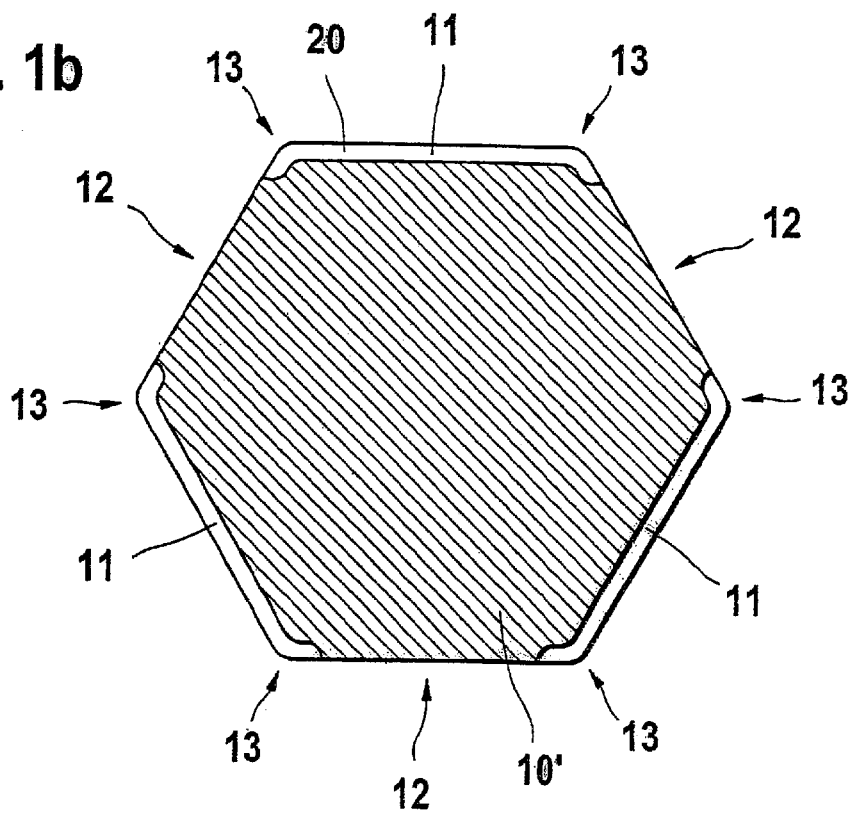
FIG. 1b shows a plan view of a second of two consecutive insulating layers within the layer sequence of the ceramic body.

In comparison with FIG. 1a, FIG. 1b shows a completely analogously constructed layer arrangement of insulating layer 20 and a second conducting layer 10', which only differs from first conducting layer 10 in that second conducting layer 10' is deposited at an angle of 60° relative to first conducting layer 10.

Figure 2:
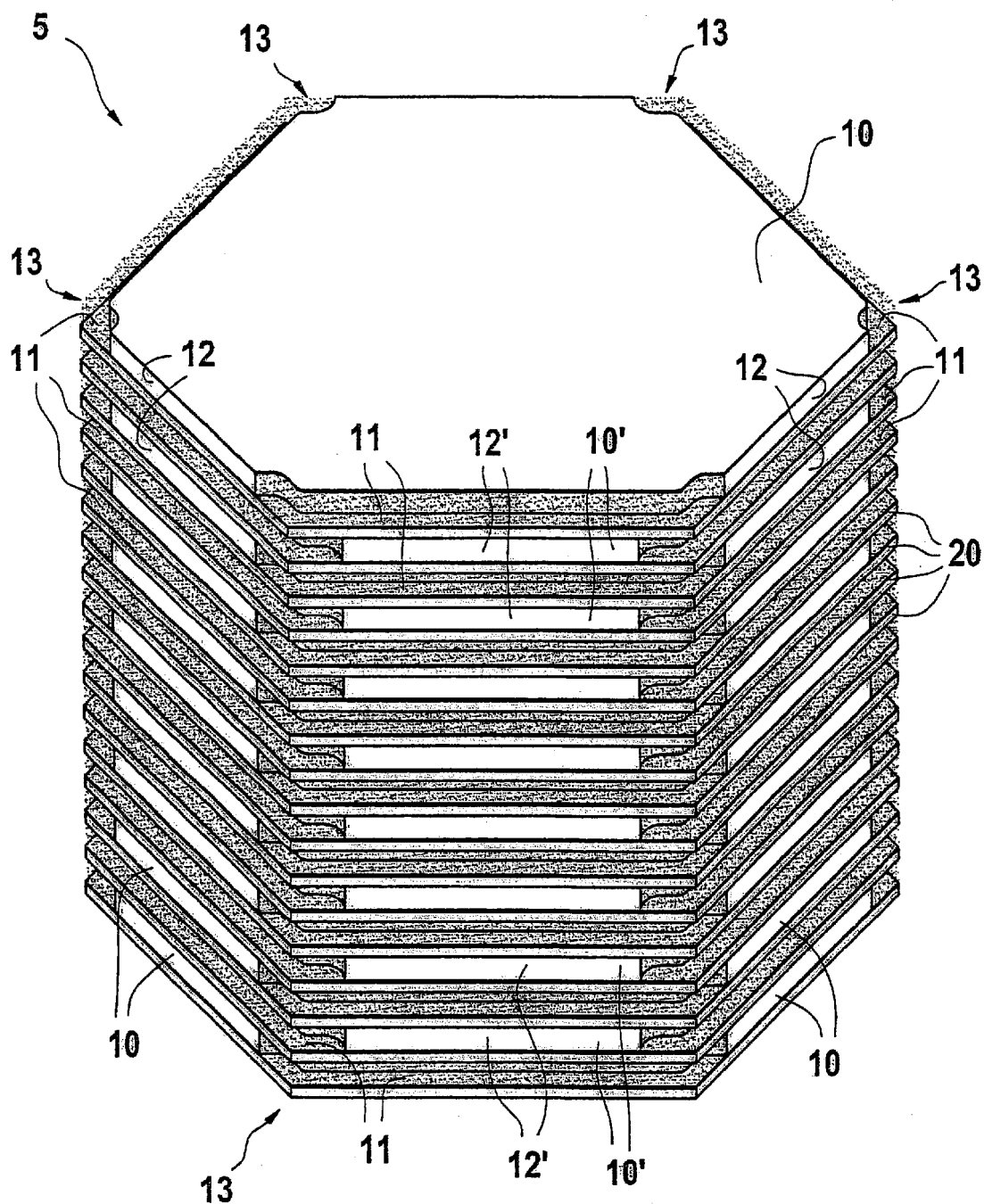
FIG. 2 shows the entire piezoelectric ceramic body.

FIG. 2 shows the complete construction of a piezoelectric ceramic body 5 made of periodic sequence known per se, of several insulating layers 20 and conducting layers 10 or 10' in the green condition, before pressing. Ceramic body 5 has a total of approximately 200 to 500 insulating layers 20. In this context, in FIG. 2, the thickness of conducting layers 10, 10' is significantly magnified in comparison with the thickness of insulating layers 20 for reasons of clarity.

Thus, ceramic body 5 is specifically made of a stack of the layer pairs represented in FIGS. 1a and 1b, which are alternately layered over one another. Thus, the layer sequence is as follows: insulating layer 20, first conducting layer 10, insulating layer 20, second conducting layer 10', insulating layer 20, first conducting layer 10, etc.

Furthermore, it is apparent in FIGS. 1a, 1b, and 2 that in every corner region 13 of insulating layer 20, insulating layer 20 is not covered by a respective conducting layer 10, 10' so that there is always a dead zone 11 there. According to the present invention, a corner region 13 is a marginal strip of insulating layer 20, which typically has a width of 30 μm to 1 mm, preferably 100 μm to 400 μm, and which extends from a corner of insulating layer 20 into each of the two sides 12 adjacent to the corner, at least for a distance of 5% to 30% of the respective length of sides 12.

Briefly summarized, the method known per se for manufacturing ceramic body 5 provides that insulating layers 20, which are in the form of ceramic green foils, are first brought into the desired form, subsequently printed on in the desired manner with conducting layers 10, 10', stacked to form a green body corresponding to FIG. 2, subsequently laminated or pressed into a female mold, and finally sintered at 1000° C. to 1300° C. to form ceramic body 5.

Upon laminating or pressing ceramic body 5, which is initially in a green condition prior to being sintered, its layers 10, 10', 20 are therefore compressed in such a manner that the unprinted regions, i.e., dead zones 11, combine. Thus, the slot-shaped hollow spaces, which are illustrated in FIG. 2 by dots, bordered from above and below by dead zones 11, and located in the layers of ceramic body 5 formed by conducting layers 10, 10', are at least filled to a large extent by the material of insulating layers 20. In this context, conducting layers 10, 10' are simultaneously pressed into insulating layers 20 and enclosed by them. During pressing or laminating, insulating layers 20 come in direct contact with one another in the region of dead zones 11 and sinter together there, later.

After sintering, the outside of obtained ceramic body 5 is typically ground and is subsequently contacted to external electrodes on the created lateral surfaces 12', 12" of the produced prism. In this context, each external electrode electrically contacts either the end faces of first conducting layers 10 or second conducting layer 10', on lateral surfaces 12', 12", the end faces being regionally accessible via lateral surfaces 12', 12", respectively, of ceramic body 5. This is possible since conducting layers 10, 10' on lateral surfaces 12', 12" regionally extend in each case to the edge of ceramic body 5.

Due to first and second conducting layers 10, 10' being alternately deposited, first and second conducting layers 10, 10', together with the respective insulating layer 20 located between them, form a plate-type capacitor having insulating layer 20 made of a piezoceramic material as a dielectric.

In detail, in a method known per se, for example, six external electrodes planarly attached to lateral surfaces 12', 12' of ceramic body 5 are contacted in such a manner that three of the six electrodes are attached to first lateral surfaces 12' of ceramic body 5 as the first electrodes, and the remaining three electrodes are attached to second lateral surfaces 12" as the second electrodes. The first electrodes are further connected to one another, and to a pole of a direct voltage source, while the second electrodes are also connected among one another and to the other pole of the direct voltage source. Applying an electrical field of 1 kV/mm to 3 kV/mm, for example, to the electrodes causes ceramic body 5 to expand or contract within the individual capacitators produced in ceramic body 5, as a result of the reverse piezoelectric effect. Since there are no conducting layers 10, 10' in the region of dead zones 11, the linear expansion only changes minimally in the region of dead zones 11.

The explained exemplary embodiment can also be easily applied to other piezoceramic materials in addition to PZT ceramic, or to other electrode materials in addition to an Ag/Pd alloy. Ceramic body 5 being shaped as a prism having a base in the form of a regular hexagon can also be easily transferred to a prism having an eight or ten-cornered base.

Furthermore, it is sufficient when only two non-equivalent lateral surfaces 12', 12" according to FIG. 2, and having external electrodes, are provided for controlling conducting layers 10, 10'. For this purpose, it is sufficient when one lateral surface 12' and one lateral surface 12" an external electrode.

Finally, in FIGS. 1a and 1b, a plurality of contact areas does not have to be provided, i.e., it is sufficient when every conducting layer 10, 10' leads to the edge of insulating layer 20 in only one region, and covers the insulating layer there so that the edge of insulating layer 20 is otherwise not covered, thereby in some instances, creating a dead zone 11, which stretches over several lateral surfaces 12', 12".

Therefore, it is obvious to one skilled in the art that ceramic body 5 according to the present invention can also be in the shape of a regular pentagon, heptagon, etc. Furthermore, ceramic body 5 does not necessarily have to be in the shape of a regular n-gon. This shape is simply preferred.

List of reference numerals 5 ceramic body
10 first conducting layer
10' second conducting layer
11 dead zone
12 side
12' first lateral surface
12" second lateral surface
13 corner region
20 insulating layer

What is claimed is:
1. A piezoelectric ceramic body, comprising:
   a plurality of insulating layers arranged one over another and made of a piezoceramic material; and
   a plurality of conducting layers made of an electrode material and by which the plurality of insulating layers are at least regionally separated from one another, wherein:
   a plan view of at least the plurality of insulating layers at least approximates a shape of an n-gon,
   n is greater than four,
   the plurality of conducting layers cover each insulating layer such that two adjacent ones of the plurality of insulating layers only come in direct contact with one another in a region of narrow dead zones,
   the region of narrow dead zones is regionally located at an outer edge of the plurality of insulating-layers, the plurality of conducting layers extend to the outer edge of the plurality of insulating layers at alternating faces of the n-gon, and the plurality of conducting layers do not extend to the outer edge of the plurality of insulating layers at adjacent faces of the n-gon.

2. The piezoelectric ceramic body according to claim 1, wherein:

the n-gon at least approximates a regular n-gon.

3. The piezoelectric ceramic body according to claim 1, wherein:

n is less than twelve.

4. The piezoelectric ceramic body according to claim 3, wherein:

n is equal to one of six and eight.

5. The piezoelectric ceramic body according to claim 1, wherein:

corners of the n-gon are at least partially rounded.

6. The piezoelectric ceramic body according to claim 1, wherein:

the plurality of insulating layers arranged over one another form a ceramic body in the shape of a vertical prism.

7. The piezoelectric ceramic body according to claim 1, wherein:

the plurality of conducting layers cover each of the plurality of insulating layers such that the plurality of conducting layers regionally extend to the outer edge of the plurality of insulating layers.

8. The piezoelectric ceramic body according to claim 1, wherein:

the plurality of conducting layers covers a respective, subjacent one of the plurality of insulating layers such that each of the plurality of conducting layers at least reaches an edge of the n-gon in a region of one side of the n-gon formed by one of the plurality of insulating layers, and such that, at least in a region of two sides of the n-gon adjacent to the one side of the n-gon, the outer edge of the one of the plurality of insulating layers is formed by one of the dead zones.

9. The piezoelectric ceramic body according to claim 1, wherein:

each of the dead zones has a width of 30 $\mu$m to 1 mm.

10. The piezoelectric ceramic body according to claim 9, wherein:

the width is 100 $\mu$m to 400 $\mu$m.

11. The piezoelectric ceramic body according to claim 6, wherein:

the plurality of conducting layers are formed between the plurality of insulating layers such that a first electrode attached to one lateral surface of the vertical prism formed by the ceramic body is, in each case, only connected in an electrically conducting manner to every second one of the plurality of conducting layers, and such that a second electrode attached to another lateral surface of the vertical prism formed by the ceramic body is, in each case, only connected in an electrically conducting manner to remaining ones of the plurality of conducting layers not contacted to the first electrode.

12. The piezoelectric ceramic body according to claim 1, wherein:

the plurality of conducting layers are made of a metal, and the plurality of insulating layers are made of a PZT ceramic.

13. The piezoelectric ceramic body according to claim 12, wherein:

the metal includes one of an Ag/Pd alloy and Pt, and the PZT ceramic includes $Pb(Ti_xZr_y)O_3$, where $0.40 < x < 0.60$.

14. The piezoelectric ceramic body according to claim 1, wherein:

at least a set of the dead zones is present in corner regions of the plurality of insulating layers.

* * * * *

UNITED STATES PATENT AND TRADEMARK OFFICE
CERTIFICATE OF CORRECTION

PATENT NO. : 6,661,156 B1
DATED : December 9, 2003
INVENTOR(S) : Stefan Henneck

It is certified that error appears in the above-identified patent and that said Letters Patent is hereby corrected as shown below:

Column 4,
Line 38, change "$0.40<x<0.60$" to -- $0.40<x<0.60.$ --; and

Column 8,
Line 32, change "$0.40<x<0.60$" to -- $0.40<x<0.60.$ --.

Signed and Sealed this

Eighteenth Day of January, 2005

JON W. DUDAS
*Director of the United States Patent and Trademark Office*